United States Patent
Wu

(10) Patent No.: US 9,412,976 B2
(45) Date of Patent: Aug. 9, 2016

(54) ORGANIC LIGHT EMITTING DIODE DEVICE AND METHOD FOR MANUFACTURING THE SAME, DISPLAY DEVICE AND ELECTRONIC PRODUCT

(71) Applicant: BOE TECHNOLOGY GROUP CO., LTD., Beijing (CN)

(72) Inventor: Changyen Wu, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/381,641

(22) PCT Filed: Mar. 14, 2014

(86) PCT No.: PCT/CN2014/073442
§ 371 (c)(1),
(2) Date: Aug. 28, 2014

(87) PCT Pub. No.: WO2015/081640
PCT Pub. Date: Jun. 11, 2015

(65) Prior Publication Data
US 2015/0162559 A1    Jun. 11, 2015

(30) Foreign Application Priority Data
Dec. 2, 2013    (CN) .......................... 2013 1 0634869

(51) Int. Cl.
*H01L 51/56*    (2006.01)
*H01L 51/50*    (2006.01)
*H01L 51/52*    (2006.01)

(52) U.S. Cl.
CPC ............ *H01L 51/56* (2013.01); *H01L 51/5012* (2013.01); *H01L 51/5044* (2013.01); *H01L 51/52* (2013.01)

(58) Field of Classification Search
CPC ............ H01L 51/5084; H01L 51/5016; H01L 27/3211; H01L 51/5068; H01L 51/56; H01L 2227/323
See application file for complete search history.

(56) References Cited

U.S. PATENT DOCUMENTS

2009/0294778 A1    12/2009    Mitsuya

FOREIGN PATENT DOCUMENTS

| CN | 101055923 | 10/2007 |
|---|---|---|
| CN | 101847692 | 9/2010 |

(Continued)

OTHER PUBLICATIONS

International Search Report and Written Opinion issued in corresponding International Application No. PCT/CN2014/073442 dated Jun. 10, 2014.

(Continued)

*Primary Examiner* — John P Dulka
(74) *Attorney, Agent, or Firm* — Baker Hostetler LLP

(57) ABSTRACT

The OLED device according to this disclosure at least includes a first electrode, a second electrode and an organic functional layer disposed between the first electrode and the second electrode. The organic functional layer at least includes a first part functional layer formed through a first process, a second part functional layer formed through a second process, and a hybrid connecting layer disposed between the first part functional layer and the second part functional layer. The hybrid connecting layer is formed by using at least a first host material and a second host material. The first host material has a hole mobility greater than its electron mobility, and the second host material has an electron mobility greater than its hole mobility.

20 Claims, 2 Drawing Sheets

(56) References Cited

FOREIGN PATENT DOCUMENTS

| CN | 102130306 |   | 7/2011 |   |
|----|-----------|---|--------|---|
| CN | 102130306 | A * | 7/2011 | .......... H01L 27/3211 |
| CN | 102842680 |   | 12/2012 |   |
| CN | 102842680 | A * | 12/2012 |   |

OTHER PUBLICATIONS

P.R. China, First Office Action, App. No. 201310634869.7, Nov. 4, 2014.

* cited by examiner

-PRIOR ART-

- PRIOR ART -

ORGANIC LIGHT EMITTING DIODE DEVICE AND METHOD FOR MANUFACTURING THE SAME, DISPLAY DEVICE AND ELECTRONIC PRODUCT

CROSS-REFERENCE TO RELATED APPLICATION

This application is the U.S. national phase of PCT Application No. PCT/CN2014/073442 filed on Mar. 14, 2014, which claims priority to Chinese Patent Application No. 201310634869.7 filed on Dec. 2, 2013, the disclosures of which are incorporated in their entirety by reference herein.

TECHNICAL FIELD

One embodiment of the present disclosure relates to the field of display technologies, and more particularly to an organic light emitting diode (OLED) device, a method for manufacturing the same, a display device and an electronic product.

BACKGROUND

An organic light emitting diode (OLED) display is a self-luminous display. Comparing with a liquid crystal display (LCD), since the OLED display does not require a backlight source, thus the OLED display is thinner. Further, the OLED display also has advantages such as high brightness, low power consumption, wide viewing angle, high response speed, wide operating temperature range, etc., and is increasingly applied in a variety of high-performance display field.

The luminescence mechanism of the OLED is that, under an external electric field, electrons and holes are injected into an organic light emitting material from positive and negative poles, they migrate in the organic light emitting material, recombine with each other and attenuate to emit light.

FIG. 1 shows a structure of an existing OLED device, which includes an anode layer 10, a cathode layer 20, and an organic functional layer 30 disposed between the two layers. The organic functional layer 30 may include a variety of functional layers including an electron transport layer 31, a hole transport layer 32 and an organic light emitting layer, etc. The organic light emitting layer usually includes organic light emitting materials of red, green and blue colors. As shown in FIG. 1, the organic light emitting layer may include a first light-emitting unit 331, a second light-emitting unit 332 and a third light-emitting unit 333 which can emit blue, red, green light, respectively.

The multi-layer structure of the OLED is to enable different functional layers to have different functions, so that various functions can be self-optimized. Interface properties between different functional layers are especially important. Since a heterojunction interface may include a plurality of complex physical mechanisms, such as energy conversion, carrier recombination, carrier separation, carrier injection, carrier accumulation, etc., thus queue time (Q-time) and process environment between different functional layers in a vacuum thermal evaporation process or surface treatment before the vacuum thermal evaporation process is especially important. The purpose is to generate a perfect interface between different materials which are used to form different functional layers.

Another existing hybrid OLED device is an OLED device, which is formed by two processes including a solution process and a vacuum thermal evaporation (VTE) process. Different materials are at two sides of an interface for different processes, respectively. During conversion of the two processes, heterojunction interface properties are necessarily affected, particularly the light emitting layers. For example, as shown in FIG. 2, in the OLED device, functional layers including the hole transport layer 32, the second light-emitting unit 332 and the third light-emitting unit 333 are formed through the solution process; thin film layers including the first light-emitting unit 331 and the electron transport layer 31 are formed through the vacuum thermal evaporation process. Since the first light-emitting unit and the second light-emitting unit as well as the third light-emitting unit are formed through different processes, thus functions of the first light-emitting unit and the second light-emitting unit as well as the third light-emitting unit will be affected.

Therefore, another OLED appears in the prior art. In the OLED, a hybrid connecting layer (HCL) formed through the vacuum thermal evaporation process is added in an interface where the solution process and the vacuum thermal evaporation process alternate. This can improve efficiency and lifetime of a first thin film layer formed through the vacuum thermal evaporation process. For example, as shown in FIG. 2, a hybrid connecting layer (HCL) 40 formed through the vacuum thermal evaporation process is disposed between the first light-emitting unit formed through the vacuum thermal evaporation process and the second light-emitting unit as well as the third light-emitting unit which are formed through the solution process. This can improve and enhance efficiency and lifetime of the first light-emitting unit.

However, the hybrid connecting layer (HCL) is required to not only play a role of transporting electrons in sub-pixels of the second light-emitting unit and the third light-emitting unit which are formed through the solution process, but also play a role of transporting holes in sub-pixels of the first light-emitting unit which is formed through the vacuum thermal evaporation process. Thus it is difficult to select materials for the hybrid connecting layer and it is also difficult to balance the carriers, thereby easily causing one of sub-pixels to emit a color of another sub-pixel.

SUMMARY

An object of one embodiment of the present disclosure is to provide an OLED device, a method for manufacturing the same, a display device and an electronic product, which can solve the problem of unbalanced carrier transport in the hybrid connecting layer, thereby improving the lifetime of the OLED, reducing an operating voltage and improving efficiency.

Technical solutions provided in one embodiment of the present disclosure are as follows.

According to one aspect of one embodiment of the present disclosure, an OLED device is provided. The OLED device may at least include a first electrode, a second electrode and an organic functional layer disposed between the first electrode and the second electrode; wherein the organic functional layer at least includes a first part functional layer formed through a first process, a second part functional layer formed through a second process, and a hybrid connecting layer disposed between the first part functional layer and the second part functional layer.

The hybrid connecting layer may be formed at least by using a first host material and a second host material; the first host material may have a hole mobility greater than its electron mobility; the second host material may have an electron mobility greater than its hole mobility.

Further, the first host material may at least include a P-type host material; and the second host material may include an N-type host material.

Further, the hybrid connecting layer may have a triplet energy greater than 2.1 eV.

Further, the organic functional layer may include: an electron transport layer disposed close to the first electrode; a hole transport layer disposed close to the second electrode; and an organic light emitting layer disposed between the hole transport layer and the electron transport layer. The organic light emitting layer may at least include a first light-emitting unit disposed close to the electron transport layer, a second light-emitting unit and a third light-emitting unit which are disposed close to the hole transport layer and are arranged in a same layer.

The first part functional layer may include the electron transport layer and the first light-emitting unit; the second part functional layer may include the hole transport layer, the second light-emitting unit and the third light-emitting unit; and the hybrid connecting layer may be disposed between the first light-emitting unit and the second light-emitting unit as well as the third light-emitting unit.

Further, an energy difference between a highest occupied molecule orbital of the first host material of the hybrid connecting layer and a highest occupied molecule orbital of the first light-emitting unit may be smaller than 3 ev.

Further, an energy difference between a highest occupied molecule orbital of the first host material of the hybrid connecting layer and a highest occupied molecule orbital of the hole transport layer may be smaller than 3 ev.

Further, an energy difference between a highest occupied molecule orbital of the first host material of the hybrid connecting layer and a highest occupied molecule orbital of the second light-emitting unit and the third light-emitting unit may be greater than 1 eV.

Further, the first light-emitting unit may be made of blue light emitting material; the second light-emitting unit may be made of red light emitting material; the third light-emitting unit may be made of green light emitting material.

Further, the hybrid connecting layer may be formed through the first process.

Further, the first process may include a vacuum thermal evaporation process; the second process may include a solution process.

According to another aspect of one embodiment of the present disclosure, a display device is provided. The display device may include a plurality of pixel units arranged in rows and columns; wherein each of the pixel units includes the above OLED device.

According to another aspect of one embodiment of the present disclosure, an electronic product is provided, wherein the electronic product includes the above display device.

According to another aspect of one embodiment of the present disclosure, a method for manufacturing an OLED device is provided. The method may include following steps: step A: sequentially forming a hole transport layer, a second light-emitting unit and a third light-emitting unit which are disposed close to the hole transport layer and are arranged in a same layer, through a second process; step B: forming a hybrid connecting layer at least by using a first host material and a second host material through a first process; wherein the first host material has a hole mobility greater than its electron mobility; and the second host material has an electron mobility greater than its hole mobility; and step C: sequentially forming a first light-emitting unit and an electron transport layer through the first process.

Beneficial effects of one embodiment of the present disclosure are as follows:

The hybrid connecting layer of the OLED according to one embodiment of the present disclosure can meet functional requirements of both of electron transport and hole transport, solve the problem of unbalanced carrier transport in the hybrid connecting layer in the prior art, thereby improving the lifetime of the OLED and achieving the purpose of reducing an operating voltage and improving efficiency.

BRIEF DESCRIPTION OF THE DRAWINGS

In order to illustrate technical solutions according to embodiments of the present disclosure or in the prior art more clearly, drawings to be used in the description of the prior art or the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

Specific implementation modalities of the present disclosure will be further described hereinafter in conjunction with the drawings and embodiments. The following embodiments are merely used to illustrate the present invention, but shall not be used to limit the scope of the present disclosure.

To make the objects, the technical solutions and the advantages of embodiments of the present disclosure more apparent, the technical solutions of the embodiments of the present disclosure will be described in detail hereinafter in conjunction with the drawings of the embodiments of the present disclosure. Apparently, the embodiments described hereinafter are only some embodiments of the present disclosure, but not all embodiments. Based the embodiments described hereinafter, other embodiments obtained by those skilled in the art should fall within the scope of the present disclosure.

Unless otherwise defined, the technical or scientific terms used in the present disclosure shall have the general meanings understandable for those ordinarily skilled in the field of the present disclosure. The wordings such as "first", "second" or similar used in the description and claims of the present disclosure shall not represent any order, number or importance, but are used for distinguishing between similar elements. Similarly, the words such as "one", "a" or similar shall not represent limitation of numbers, but mean existence of at least one. The phrases "joint", "connect" or similar are not limited to physical or mechanical connection, but also include electrical connection, no matter directly or indirectly. The phrases "upper", "lower", "left", "right" and etc. shall be used only to represent relative positions, wherein, when the absolute position of the described object is changed, the relative positions may be changed accordingly.

Principles and features of the present disclosure will be further described hereinafter in conjunction with the drawings. The following embodiments are merely used to illustrate the present invention, but shall not be used to limit the scope of the present disclosure.

Figure 3:
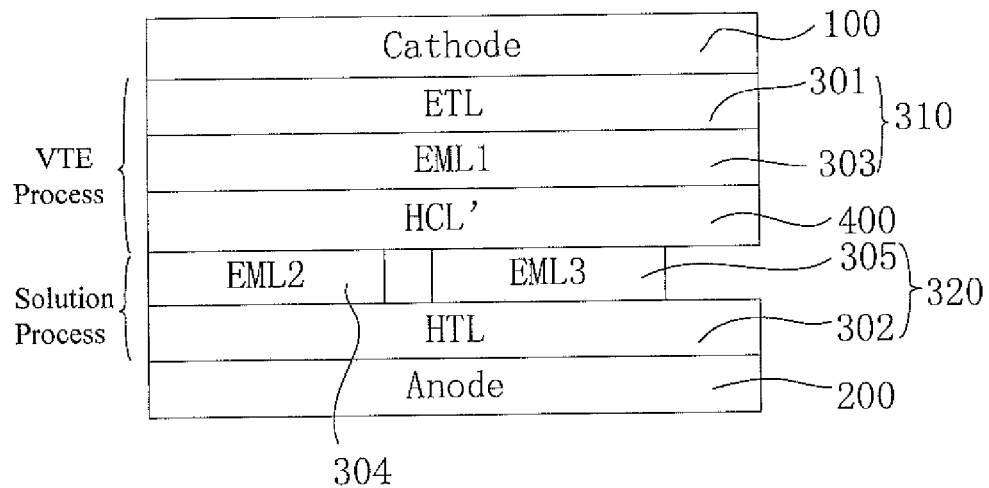
FIG. 3 is a schematic diagram showing a structure of a Hybrid OLED device according to one embodiment of the present disclosure.

As shown in FIG. 3, one embodiment of the present disclosure provides an OLED device. The OLED device at least includes a first electrode 100, a second electrode 200 and an organic functional layer disposed between the first electrode 100 and the second electrode 200. The organic functional layer at least includes a first part functional layer 310 formed through a first process and a second part functional layer 320 formed through a second process. A hybrid connecting layer 400 is disposed between the first part functional layer 310 and the second part functional layer 320. For example, the hybrid connecting layer 400 is formed at least by using a first host material and a second host material. For example, the first host material has a hole mobility greater than its electron mobility, whereas the second host material has an electron mobility greater than its hole mobility.

Figure 1:
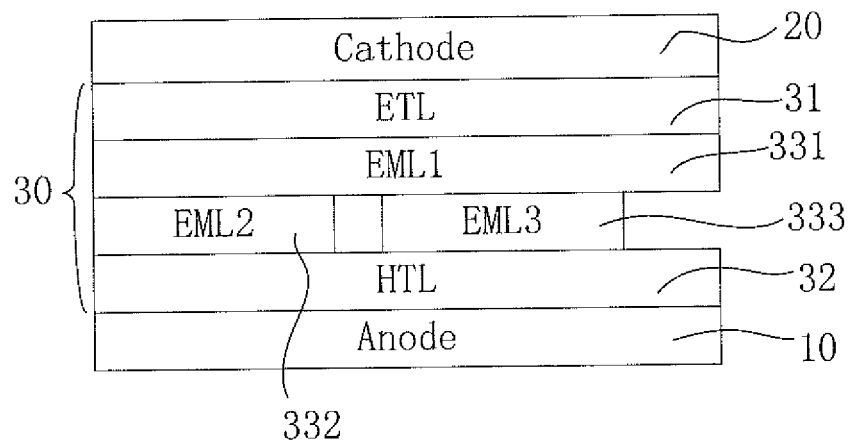
FIG. 1 is a schematic diagram showing a structure of an OLED device in the prior art.
Figure 2:
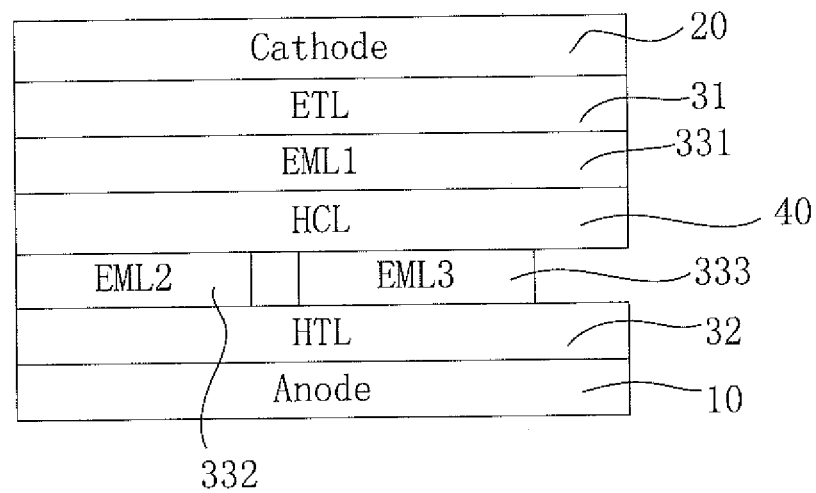
FIG. 2 is a schematic diagram showing a structure of a Hybrid OLED device in the prior art.

In the above technical solution, at least one part of the organic functional layer of the OLED device is formed through the first process; and at least another part of the organic functional layer of the OLED device is formed through the second process. The hybrid connecting layer 400 is disposed in an interface where the two processes alternate, and the hybrid connecting layer 400 is formed at least by using the first host material with its hole mobility greater than its electron mobility and the second host material with its electron mobility greater than its hole mobility. The hybrid connecting layer 400 formed by using the first host material and the second host material can meet functional requirements of both of electron transport and hole transport, solve the problem of unbalanced carrier transport in the hybrid connecting layer (for example, the hybrid connecting layer 40 shown in FIG. 2) in the prior art, thereby improving the lifetime of the OLED and achieving the purpose of reducing an operating voltage and improving efficiency.

For example, the first host material may adopt a P-type host material having a hole mobility greater than its electron mobility, whereas the second host material may adopt an N-type host material having an electron mobility greater than its hole mobility. Further, the hybrid connecting layer 400 has a triplet energy greater than 2.1 eV.

It should be noted that, the first electrode 100 and the second electrode 200, for example, may be an anode or a cathode. One embodiment of the present disclosure takes the first electrode 100 being a cathode and the second electrode 200 being an anode as an example for illustration, but is not limited to this.

It also should be noted that, the first process and the second process may specifically adopt any one of existing substrate manufacturing techniques which may realize patterning. One embodiment of the present disclosure takes the first process being the vacuum thermal evaporation (VTE) process and the second process being the solution process as an example for illustration, but is not limited to this.

An OLED device provided in one embodiment of the present disclosure is described hereinafter.

As shown in FIG. 3, the OLED device includes a first electrode 100, a second electrode 200 and an organic functional layer disposed between the first electrode 100 and the second electrode 200.

For example, the organic functional layer includes:

an electron transport layer (ETL) 301 disposed close to the first electrode 100;

a hole transport layer (HTL) 302 disposed close to the second electrode 200; and an organic light emitting layer (EML) disposed between the hole transport layer 302 and the electron transport layer 301.

For example, the organic light emitting layer includes a first light-emitting unit (EML1) 303, a second light-emitting unit (EML2) 304 and a third light-emitting unit (EML3) 305.

For example, the first light-emitting unit 303 is disposed close to the electron transport layer 301; both of the second light-emitting unit 304 and the third light-emitting unit 305 are disposed close to the hole transport layer 302.

For example, the first part functional layer 310 includes the electron transport layer 301 and the first light-emitting unit 303; the second part functional layer 320 includes the hole transport layer 302, the second light-emitting unit 304 and the third light-emitting unit 305.

For example, the hybrid connecting layer 400 is formed between the first light-emitting unit 303 and the second light-emitting unit 304 as well as the third light-emitting unit 305.

For example, in one embodiment of the present disclosure, the electron transport layer 301 and the first light-emitting unit 303 in the organic functional layer are formed through the first process (VTE process); the second light-emitting unit 304, the third light-emitting unit 305 and the hole transport layer 302 in the organic functional layer are formed through the second process (solution process). The hybrid connecting layer 400 is disposed between the first light-emitting unit 303 formed through the VTE process and the second light-emitting unit 304 as well as the third light-emitting unit 305 formed through the solution process.

It should be noted that, in one embodiment of the present disclosure, structures of the organic functional layer are not limited to the above. For example, the organic functional layer may further include a hole injection layer and an electron injection layer. The hole injection layer may be disposed at one side of the hole transport layer 302 away from the organic light emitting layer; the electron injection layer may be disposed at one side of the electron transport layer 301 away from the organic light emitting layer.

Further, it also should be noted that, in the above embodiment, the interface where the two processes alternate is disposed in the organic light emitting layer. In one embodiment of the present disclosure, the interface where the two processes alternate may also be disposed between other functional layers of the organic functional layer. For example, the interface where the two processes alternate is not disposed between the first light-emitting unit 303 and the second light-emitting unit 304 as well as the third light-emitting unit 305, but is disposed between the organic light emitting layer and the electron transport layer 301. At this time, the hybrid connecting layer 400 is disposed between the organic light emitting layer and the electron transport layer 301. Other situations will not be described in detail here.

In addition, the first light-emitting unit 303, the second light-emitting unit 304 and the third light-emitting unit 305 are made of blue, green and red light emitting materials, respectively. Of course, they may also be made of light emitting materials having other colors. In one embodiment of the present disclosure, the first light-emitting unit 303 is made of a blue light emitting material; the second light-emitting unit 304 is made of a red light emitting material; and the third light-emitting unit 305 is made of a green light emitting material. It can be understood that, in actual applications, the first light-emitting unit 303 may also be made of a green light emitting material; the second light-emitting unit 304 may also be made of a red light emitting material; and the third light-emitting unit 305 may also be made of a blue light emitting material. Other situations will not be described in detail here.

In addition, it also should be noted that, in one embodiment of the present disclosure, the first light-emitting unit 303, the second light-emitting unit 304 and the third light-emitting unit 305 are arranged into two layers. However, in actual applications, the first light-emitting unit 303, the second light-emitting unit 304 and the third light-emitting unit 305 may also be arranged into three layers. Of course, this is only one example for illustration. One embodiment of the present disclosure does not limit the number of the light-emitting units in the organic light emitting layer and arrangement forms of each of the light-emitting units.

It also should be rioted that, in one embodiment of the present disclosure, the organic emitting layer 400 may be formed through the same process as that of the first part functional layer 310, i.e., the first process (VTE process).

In order to further ensure a balanced carrier transport in the hybrid connecting layer 400, in one embodiment of the present disclosure, an energy difference between a highest occupied molecule orbital (HOMO) of the first host material of the hybrid connecting layer 400 and a highest occupied molecule orbital of the first light-emitting unit 303 is smaller than 3 ev. An energy difference between the highest occupied molecule orbital of the first host material of the hybrid connecting layer 400 and a highest occupied molecule orbital of the hole transport layer 302 is smaller than 3 ev. An energy difference between the highest occupied molecule orbital of the first host material of the hybrid connecting layer 400 and a highest occupied molecule orbital of the second light-emitting unit 304 and the third light-emitting unit 305 is greater than 1 eV.

Figure 4:
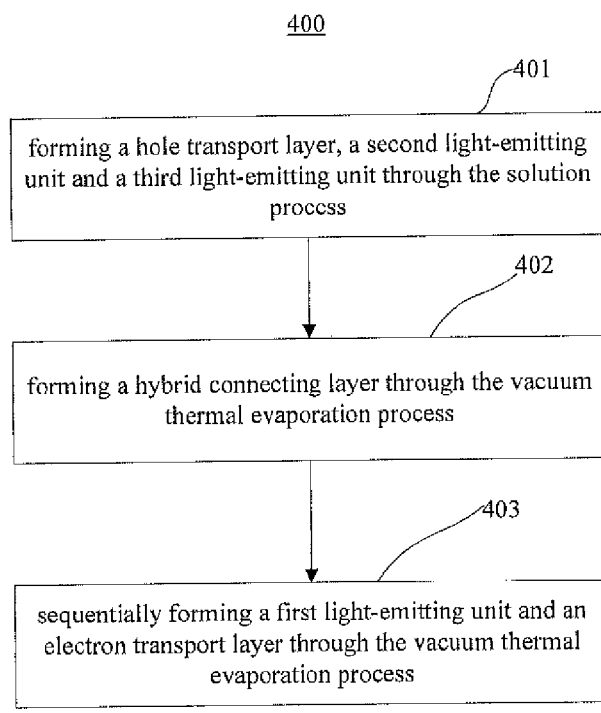
FIG. 4 is a flow chart of a method for manufacturing Hybrid OLED devices according to one embodiment of the present disclosure.

FIG. 4 is a flow chart of a method 400 for manufacturing hybrid OLED devices according to one embodiment of the present disclosure. As shown in FIG. 4, when manufacturing the OLED device according to one embodiment of the present disclosure, step 401: first forming a hole transport layer, a second light-emitting unit and a third light-emitting unit, for example, through a solution process; step 402: then, forming a hybrid connecting layer, for example, through a vacuum thermal evaporation (VTE) process; step 403: then, sequentially forming a first light-emitting unit and an electron transport layer, for example, through the VTE process.

One embodiment of the present disclosure further provides a display device which includes a plurality of pixel units. Each of the pixel units includes the OLED device according to one embodiment of the present disclosure. In one embodiment of the present disclosure, each of the pixel units of the display device has three or more colors. The organic light emitting layer of the OLED device includes a first light-emitting unit, a second light-emitting unit and a third light-emitting unit, which can emit blue, red, green light, respectively. Of course, the OLED device includes but is not limited to include three light-emitting units, and may further include a plurality of light-emitting units which can emit light of other colors. The display device according to one embodiment of the present disclosure further includes a hybrid connecting layer 400 formed through the vacuum thermal evaporation (VTE) process disposed in an interface of an organic functional layer where two processes alternate. The hybrid connecting layer 400 includes two or more kinds of material, and usually includes a P-type host material and an N-type host material. The hybrid connecting layer 400 is simultaneously manufactured on sub-pixels having a plurality of colors.

One embodiment of the present disclosure further provides an electronic product. The electronic product at least includes the above display device. The electronic product, for example, may be a mobile phone, a computer, a television, a digital camera, etc.

Those described above are only embodiments of the present disclosure, but shall not be used to limit the present disclosure. For those skilled in the art, some modifications and alterations may be made without departing from the basic concept and the scope of the present disclosure, and these should fall within the scope of the present disclosure. Thus, the protection scope of the present disclosure should be based on the claims.

What is claimed is:

1. An organic light emitting diode (OLED) device at least comprising a first electrode, a second electrode and an organic functional layer disposed between the first electrode and the second electrode; wherein the organic functional layer at least comprises a first part functional layer formed through a first process, a second part functional layer formed through a second process, and a hybrid connecting layer disposed between the first part functional layer and the second part functional layer; wherein
   the hybrid connecting layer is formed at least by using a first host material and a second host material; the first host material has a hole mobility greater than its electron mobility; and the second host material has an electron mobility greater than its hole mobility.

2. The OLED device according to claim 1, wherein
   the first host material at least comprises a P-type host material; and
   the second host material at least comprises an N-type host material.

3. The OLED device according to claim 1, wherein
   the hybrid connecting layer has a triplet energy greater than 2.1 eV.

4. The OLED device according to claim 1, wherein
   the hybrid connecting layer is formed through the first process; and
   the first process comprises a vacuum thermal evaporation process; and the second process comprises a solution process.

5. The OLED device according to claim 1, wherein
   the organic functional layer at least comprises:
   an electron transport layer disposed close to the first electrode;
   a hole transport layer disposed close to the second electrode; and
   an organic light emitting layer disposed between the hole transport layer and the electron transport layer.

6. The OLED device according to claim 5, wherein
   an energy difference between a highest occupied molecule orbital of the first host material of the hybrid connecting layer and a highest occupied molecule orbital of the hole transport layer is smaller than 3 ev.

7. The OLED device according to claim 5, wherein
   the organic light emitting layer at least comprises:
   a first light-emitting unit disposed close to the electron transport layer, a second light-emitting unit and a third light-emitting unit which are disposed close to the hole transport layer and are arranged in a same layer;
   wherein the first part functional layer at least comprises the electron transport layer and the first light-emitting unit;
   the second part functional layer at least comprises the hole transport layer, the second light-emitting unit and the third light-emitting unit; and
   the hybrid connecting layer is disposed between the first light-emitting unit and the second light-emitting unit as well as the third light-emitting unit.

8. The OLED device according to claim 7, wherein
   an energy difference between a highest occupied molecule orbital of the first host material of the hybrid connecting layer and a highest occupied molecule orbital of the first light-emitting unit is smaller than 3 ev.

9. The OLED device according to claim 7, wherein an energy difference between a highest occupied molecule orbital of the first host material of the hybrid connecting layer and a highest occupied molecule orbital of the second light-emitting unit and the third light-emitting unit is greater than 1 eV.

10. The OLED device according to claim 7, wherein the first light-emitting unit is made of a blue light emitting material; the second light-emitting unit is made of a red light emitting material; and the third light-emitting unit is made of a green light emitting material.

11. A display device comprising a plurality of pixel units arranged in rows and columns; wherein each of the pixel units comprises an organic light emitting diode (OLED) device at least comprising a first electrode, a second electrode and an organic functional layer disposed between the first electrode and the second electrode; wherein the organic functional layer at least comprises a first part functional layer formed through a first process, a second part functional layer formed through a second process, and a hybrid connecting layer disposed between the first part functional layer and the second part functional layer; wherein
the hybrid connecting layer is formed at least by using a first host material and a second host material; the first host material has a hole mobility greater than its electron mobility; and the second host material has an electron mobility greater than its hole mobility.

12. The display device according to claim 11, wherein the first host material at least comprises a P-type host material; and
the second host material at least comprises an N-type host material.

13. The display device according to claim 11, wherein the hybrid connecting layer has a triplet energy greater than 2.1 eV.

14. The display device according to claim 11, wherein the organic functional layer at least comprises:
an electron transport layer disposed close to the first electrode;
a hole transport layer disposed close to the second electrode; and
an organic light emitting layer disposed between the hole transport layer and the electron transport layer.

15. The display device according to claim 14, wherein an energy difference between a highest occupied molecule orbital of the first host material of the hybrid connecting layer and a highest occupied molecule orbital of the hole transport layer is smaller than 3 ev.

16. The display device according to claim 14, wherein the organic light emitting layer at least comprises:
a first light-emitting unit disposed close to the electron transport layer, a second light-emitting unit and a third light-emitting unit which are disposed close to the hole transport layer and are arranged in a same layer;
wherein the first part functional layer at least comprises the electron transport layer and the first light-emitting unit;
the second part functional layer at least comprises the hole transport layer, the second light-emitting unit and the third light-emitting unit; and
the hybrid connecting layer is disposed between the first light-emitting unit and the second light-emitting unit as well as the third light-emitting unit.

17. The display device according to claim 16, wherein an energy difference between a highest occupied molecule orbital of the first host material of the hybrid connecting layer and a highest occupied molecule orbital of the first light-emitting unit is smaller than 3 ev.

18. The display device according to claim 16, wherein an energy difference between a highest occupied molecule orbital of the first host material of the hybrid connecting layer and a highest occupied molecule orbital of the second light-emitting unit and the third light-emitting unit is greater than 1 eV.

19. The display device according to claim 16, wherein the first light-emitting unit is made of a blue light emitting material; the second light-emitting unit is made of a red light emitting material; and the third light-emitting unit is made of a green light emitting material.

20. A method for manufacturing an organic light emitting diode (OLED) device, comprising following steps:
sequentially forming a hole transport layer, a second light-emitting unit and a third light-emitting unit which are disposed close to the hole transport layer and are arranged in a same layer, through a second process;
forming a hybrid connecting layer at least by using a first host material and a second host material through a first process; wherein the first host material has a hole mobility greater than its electron mobility, and the second host material has an electron mobility greater than its hole mobility; and
sequentially forming a first light-emitting unit and an electron transport layer through the first process.

* * * * *